United States Patent [19]

Kusano et al.

[11] Patent Number: 5,115,147
[45] Date of Patent: May 19, 1992

[54] DRIVER FOR LIGHT EMITTING DEVICE FOR PROVIDING A STABLE BEAM OUTPUT

[75] Inventors: Akihisa Kusano, Kawasaki; Junichi Kimizuka, Yokohama; Toshiyuki Ito, Sagamihara; Kaoru Sato, Hiyoshi; Makoto Abe, Kashiwa; Kazuhiko Okazawa, Kawasaki; Toshihiko Inuyama, Fujisawa, all of Japan

[73] Assignee: Canon Kabushiki Kaisha, Japan

[21] Appl. No.: 358,867

[22] Filed: May 31, 1989

[30] Foreign Application Priority Data

Jun. 1, 1988 [JP] Japan .................. 63-134823

[51] Int. Cl.⁵ .................. H01S 3/00; H03K 3/01
[52] U.S. Cl. .................. 307/311; 307/270; 372/29; 372/31; 372/38
[58] Field of Search .......... 350/333, 332; 340/784; 307/311, 270, 254, 362, 363; 372/38, 31, 29; 357/17

[56] References Cited

U.S. PATENT DOCUMENTS

| | | | |
|---|---|---|---|
| 4,412,331 | 10/1983 | Chapman | 372/38 |
| 4,531,217 | 7/1985 | Kitamura | 372/50 |
| 4,539,686 | 9/1985 | Bosch et al. | 372/38 |
| 4,571,506 | 2/1986 | Lisco | 307/311 |
| 4,580,044 | 4/1986 | Hongo et al. | 372/31 |
| 4,622,477 | 11/1986 | Uda | 307/311 |
| 4,647,792 | 3/1987 | Meslener et al. | 307/311 |
| 4,807,239 | 2/1989 | Takano et al. | 372/38 |
| 4,809,286 | 2/1989 | Kollanyi et al. | 372/38 |
| 4,818,896 | 4/1989 | Cavanna | 307/311 |
| 4,845,720 | 7/1989 | Koishi et al. | 372/38 |
| 4,856,011 | 8/1989 | Shibada et al. | 372/31 |
| 4,899,344 | 2/1990 | Shibata et al. | 372/38 |

FOREIGN PATENT DOCUMENTS

| | | | |
|---|---|---|---|
| 57-096583 | 6/1982 | Japan | 372/50 |
| 59-35494 | 2/1984 | Japan | 372/38 |
| 59-151481 | 8/1984 | Japan | 372/38 |
| 60-170281 | 9/1985 | Japan | 372/38 |
| 61-201483 | 9/1986 | Japan | 357/17 |
| 61-224385 | 10/1986 | Japan | 372/38 |
| 61-279188 | 12/1986 | Japan | 372/38 |
| 62-236208 | 10/1987 | Japan | 307/311 |
| 60-273787 | 11/1987 | Japan | 372/38 |
| 63-87820 | 4/1988 | Japan | 307/311 |
| 1-205575 | 8/1989 | Japan | 357/17 |
| 1-239884 | 9/1989 | Japan | 357/17 |

OTHER PUBLICATIONS

High power optical fiber data transmission using CHD-LOC AlGaAs laser diodes IEEE Channin et al. CH1708-7/81/0000-0452.

Primary Examiner—Rolf Hille
Assistant Examiner—Minhloan Tran
Attorney, Agent, or Firm—Fitzpatrick, Cella, Harper & Scinto

[57] ABSTRACT

A driver for a light emitting device comprises first and second switching means associated with the light emitting device and application means for applying voltages to the first and second switching means to perform the switching operation in accordance with an input signal. The application means applies voltages of essentially same level to the first and second switching means.

4 Claims, 5 Drawing Sheets

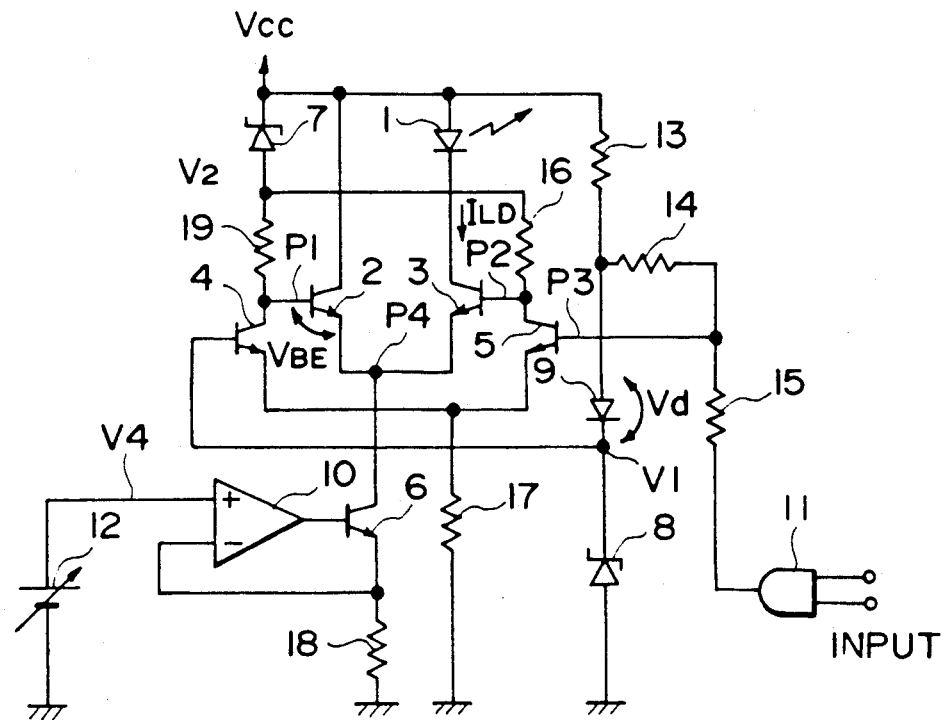
F I G. 1
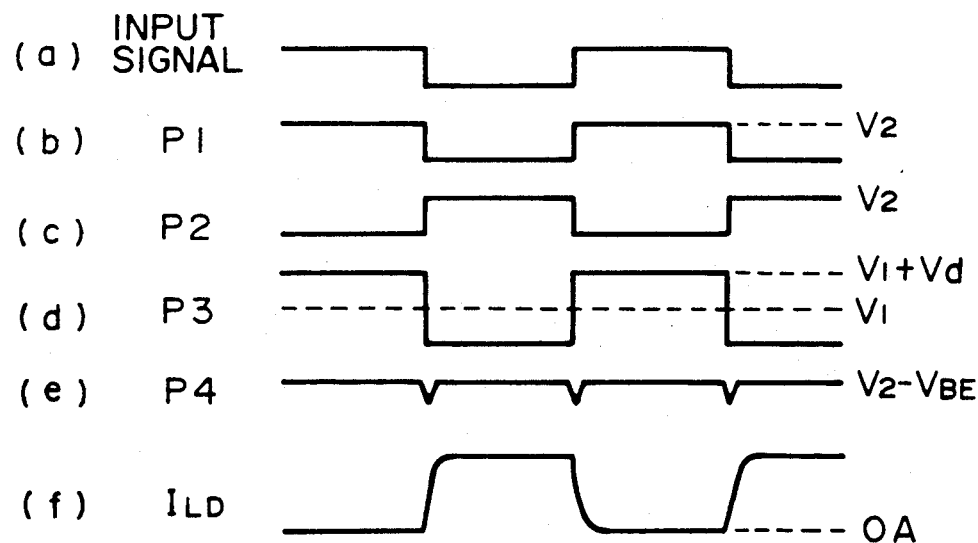
F I G. 2

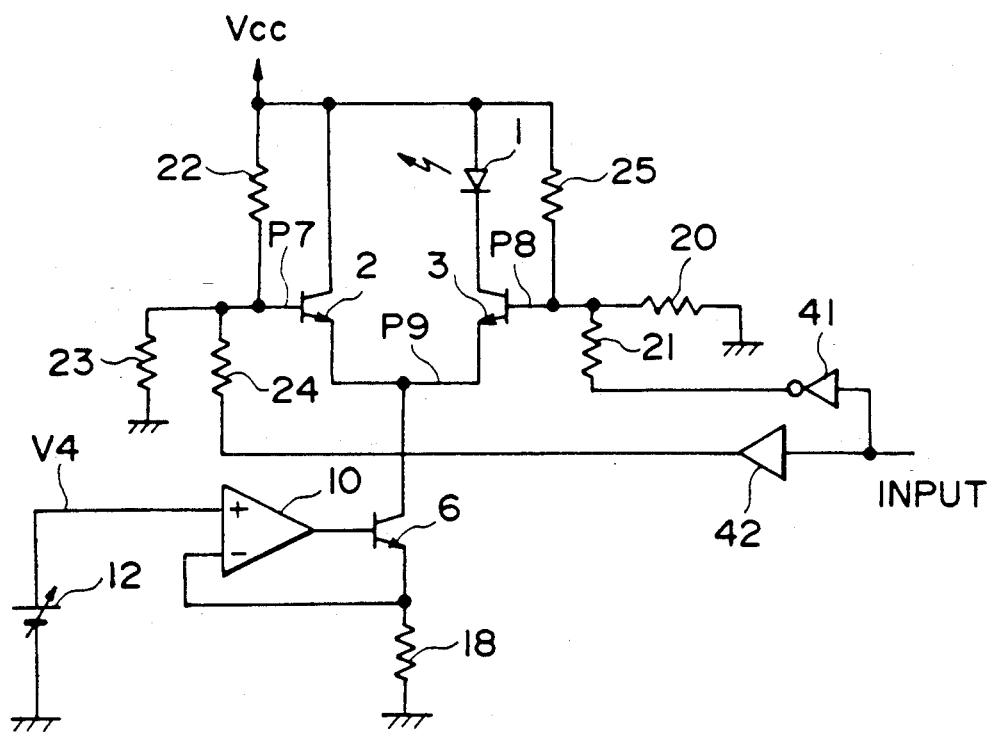
F I G. 3

DRIVER FOR LIGHT EMITTING DEVICE FOR PROVIDING A STABLE BEAM OUTPUT

BACKGROUND OF THE INVENTION

1. Field of the Invention

The present invention relates to a driver for driving a light emitting element such as a semiconductor laser.

2. Related Background Art

In a laser beam printer, various drivers for driving the semiconductor laser have been used.

FIG. 4 shows a prior art driver for a laser diode in a constant current differential switching system. It is, for example, a differential current switch like that shown in Japanese patent Application Laid-Open No. 57-96583.

In FIG. 4, a constant current circuit comprises a power supply 12, an operational amplifier 10, a resistor 18 and a transistor 6. A collector current $I_{LD}$ of transistor 6 in the constant current circuit is expressed by the following formula, as shown in FIG. 6

$$I_{LD} = \frac{(\text{voltage V4 of the power supply 12})}{(\text{resistance of the resistor 18})}$$

the base potential of transistor 3 is set to a constant potential (V3). The base potential P10 of the transistor 2 is set by resistors 26, 27 and 30 such that it is higher than the potential V3 when an output of an open-collector output AND gate 11 is "1" and lower than the voltage V3 when the output of the AND gate 11 is "0".

When input signals to the AND gate 11 are "1", the output of the AND gate 11 is also "1" and the base potential P10 of transistor 2 is higher than the base potential V3 of transistor 3 so that transistor 2 is turned on and transistor 3 is turned off. Accordingly, no current flows through the laser diode 1. In this case, a collector potential of the transistor 6 is equal to (base potential P10 of the transistor 2) – ($V'_{BE}$), where $V_{BE}$ is a base-emitter voltage of the transistor 2.

On the other hand, when the input signals to the AND gate 11 are "0", the output of the AND gate 11 is also "0" and base potential P10 of the transistor 2 is lower than base potential V3 of transistor 3 so that transistor 2 is turned off and transistor 3 is turned on. Accordingly, a current determined by the output of the constant current circuit flows through the laser diode 1. In this case, the collector potential P11 of transistor 6 is equal to (potential V3) – ($V_{BE}$)

However, in this circuit, base potential P10 of transistor 2 changes as shown in FIG. 5(b) each time the input signals to the AND gate 11 change as shown in FIG. 5(a). Since the collector potential P11 of the transistor 6 changes as base potential P10 of the transistor 2 changes, the collector potential P11 of the transistor 6 oscillates as shown in FIG. 5(c) and the output current of the constant current circuit varies accordingly. Thus, the current $I_{LD}$ flowing through the laser diode 1 oscillates (overshoots) as shown in FIG. 5(d).

As seen from a current-light intensity characteristic of the laser diode 1 shown in FIG. 7, even a small change in the current ($\Delta I_{LD}$) causes a large change in the light intensity ($\Delta P_{LD}$).

Particularly in the laser printer, image quality is degraded by the overshoot, while an excess current flow shortens the life of the laser diode 1.

On the other hand, the overshoot may be absorbed by using capacitors and coils but this decreases the switching speed.

SUMMARY OF THE INVENTION

It is an object of the present invention to eliminate the defects described above.

It is another object of the present invention to improve the driver for the light emitting device.

It is another object of the present invention to provide a driver for the light emitting device, which operates at a high switching speed.

It is another object of the present invention to provide a driver for the light emitting device, which has a long life time.

It is another object of the present invention to provide a driver for the light emitting device, which produces a high grade image when it is applied to a recorder.

It is another object of the present invention to provide a driver for the light emitting device which permits a stable beam output.

It is another object of the present invention to provide a driver for the light emitting device, which produces a desired beam output with a simple configuration.

Other objects of the present invention will be apparent from the following description made with reference to the accompanying drawings.

BRIEF DESCRIPTION OF THE DRAWINGS

FIG. 1 shows a block diagram of one embodiment of the present invention,

FIG. 2(a)-(2f) show a timing chart in the embodiment.

FIG. 3 shows a circuit diagram of another embodiment of FIG. 1 of the present invention.

DESCRIPTION OF THE PREFERRED EMBODIMENTS

Figure 4:
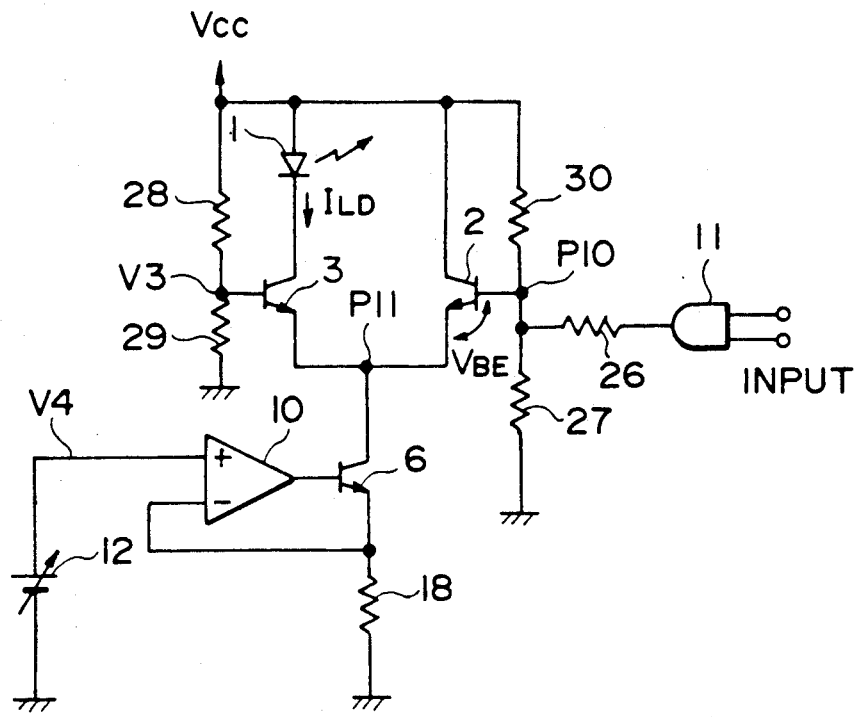
FIG. 4 shows a circuit diagram of a prior art circuit.

FIG. 1 shows a circuit diagram of one embodiment of the present invention.

The like elements to those shown in the prior art circuit are designated by the like numerals.

The present embodiment comprises a transistor 4 for driving a transistor 2, a transistor 5 for driving a transistor 3, a Zener diode 7 for keeping a voltage supplied to the collectors of transistors 4 and 5 at a constant level, a Zener diode 8 for keeping a base potential of transistor 4 at a constant potential V1, a diode 9 connected in series with the Zener diode 8, and resistors 13–19.

The transistors 2 and 3 are constant current differential switching transistors, that is, first and second transistors which operate complementarily to each other. The transistors 4 and 5, the Zener diodes 7 and 8, the diode 9 and the resistors 13, 14, 15, 16, 17 and 19 constitute signal supply means for supplying signals of opposite phases and equal amplitude to the first transistor 2 and the second transistor 3.

The base potential P3 of transistor 5 is set by the resistors 13, 14 and 15 such that it is equal to V1+Vd (constant) when the output of the AND gate 11 is "1"

and lower than V1 when the output of the AND gate 11 is "0".

The operation of the present embodiment is now explained.

When the input signals to the AND gate 11 is "0", transistor 4 is turned on and transistor 5 is turned off. In this case, base potential P1 of the transistor 2 is lower than V2, and base potential P2 of transistor 3 is essentially equal to V2.

On the other hand, when the input signals to the AND gate 11 are "1", transistor 4 is turned off and transistor 5 is turned on. In this case, base potential P1 of transistor 2 is essentially equal to V2 and base potential P2 of transistor 3 is lower than V2.

The collector potential of the turn-off transistor of transistors 4 and 5 is essentially equal to V2 because the collector current of the turn-off transistor when it is turned on is sufficiently larger than base current of transistor 2 or 3 connected to the collector of the turn-off transistor.

As described above, when the input signals to the AND gate 11 are "0", transistor 2 is turned off and transistor 3 is turned on, and when the input signals are "1", transistor 2 is turned on and the transistor 3 is turned off, and base potential of the turn-on transistor 2 or 3 is always essentially equal to V2. Accordingly, the collector potential P4 of the output transistor 6 of the constant current circuit is essentially equal to $(V2)-(V_{BE})$ and varies slightly when the input signals to the AND gate 11 are switched Accordingly, in the laser printer which uses the laser diode, the degradation of the image quality is low and the shortening of the lifetime of the laser diode due to the excess current is prevented. Further, since no capacitor or coil is used in the present embodiment, high speed switching is attained.

When the input signals to the AND gate 11 are inverted, the collector potential P4 of transistor 6 slightly changes as shown in FIG. 2(e). The overshoot or ringing generated in the output current of the constant current circuit is very small and the current $I_{LD}$ flowing through the laser diode is stable as shown in FIG. 2(f), and the switching speed is high. FIG. 2(a) shows the input signal to the AND gate 11. FIG. 2(b) shows base potential P1 of transistor 2. FIG. 2(c) shows the base potential P2 of transistor 3 and FIG. 2(d) shows base potential P3 of transistor 5.

By lowering the voltages developed in the resistors 19 and 16 connected to the collectors of transistors 4 and 5, the change in the potential P4 when transistor 4 or 5 is turned on can be further reduced. However, it is necessary to develop in the resistors 19 and 16 sufficient voltages (for example, higher than 0.6 V) for transistors 2 and 3 to operate in the differential switching mode.

FIG. 3 shows a circuit diagram of another embodiment of the present invention.

In FIG. 3, the like elements to those shown in the embodiment of FIG. 1 are designated by the like numerals and the explanation thereof is omitted.

In the present embodiment, the resistors 20~25, a driver 42 and an inverter 41 are provided such that base potential of transistor 2 when transistor 2 is turned on is equal to base potential of the transistor 3 when transistor 3 is on.

The transistors 2 and 3 are constant current differential switching transistors, that is, first and second transistors which operate complementarily to each other. The resistors 20~25, the driver 42 and the inverter 41 constitute signal supply means for supplying signals of opposite phases and essentially equal amplitude to the first and second transistors.

In the embodiment of FIG. 3, the emitter potential P9 of transistor 2 when transistor 2 is turned on is equal to the emitter potential (P9) of transistor 3 when transistor 3 is turned on. Thus, stable and high speed switching is attained as it is in the embodiment of FIG. 1.

Figure 8:
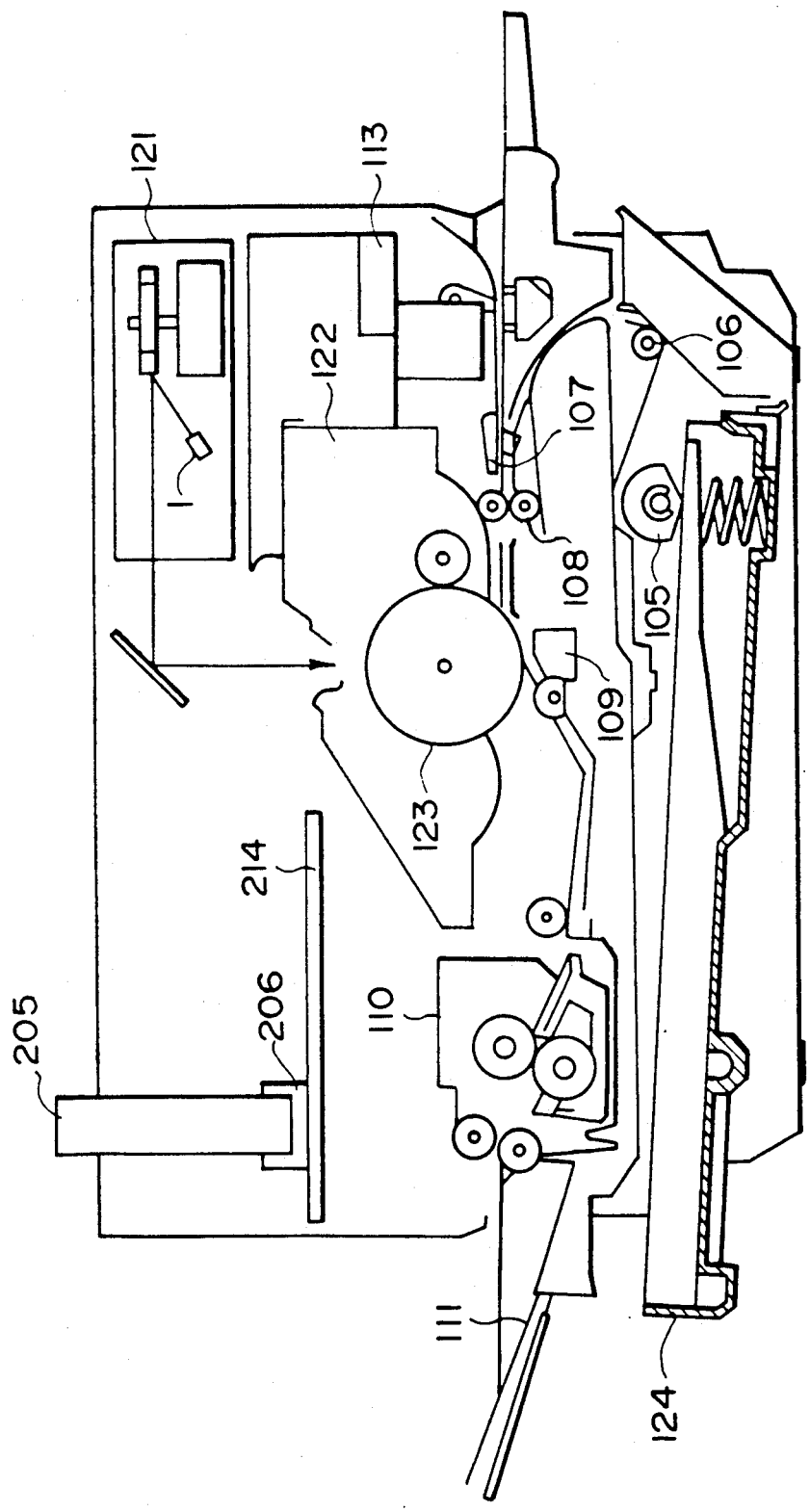
FIG. 8 shows a schematic view of a laser beam printer to which the present invention is applicable.

FIG. 8 shows a schematic sectional view of a laser beam printer to which the present invention is applicable.

In FIG. 8, numeral 121 denotes a light exposure unit having a scanner and a laser unit, and numeral 122 denotes a develop unit for visualizing a latent image formed on a photoconductor drum 123, numeral 124 denote a paper cassette; and numeral 105 denotes a feed roller for feeding a sheet from the paper cassette 124 to the feed roller 106, one sheet at a time. Numeral 107 denotes a redigest shutter. The sheet fed by the feed roller 106 is temporarily stopped by the redigest shutter 107 so that synchronization is attained between the projection of the laser beam and the rotation of the photoconductor drum 123, and the sheet feed. Numeral 108 denotes a feed roller for feeding the sheet to a transfer unit 109, numeral 110 denotes a fixing unit for fixing the toner image transferred onto the sheet, and numeral 111 denotes a stocker for receiving the ejected sheet.

Numeral 205 denotes a plugable character generator, numeral 206 denotes a socket, and numeral 214 denotes a CPU board having a CPU for processing various data supplied from a host (not shown) to generate image information and an output buffer for storing the image information.

In the laser beam printer thus constructed, a series of operation timings such as sheet feed and development are controlled by a sequence controller 113. The laser beam printer turns on and off the laser beam in accordance with a video signal supplied from a printer interface unit (not shown) to form a visible image on the photoconductor drum 123.

The driver shown in FIG. 1 or FIG. 3 may be mounted in the laser unit 121.

Of the input signals to the AND gate 11 of FIG. 1, one may be the video signal and the other may be a print permit signal.

In accordance with the present embodiment, in the laser printer which uses the laser diode, the degradation of the image quality is low, the shortening of the lifetime of the laser diode due to the excess current is prevented, and the high speed switching is attained.

The present invention is also applicable to a recorder other than the laser beam printer, such as an LED printer.

The present invention is not limited to the illustrated embodiments but various modifications may be made within the scope of the claim.

We claim:

1. A driver for a light emitting device, comprising:
   first switching means having a first control terminal and second switching means having a second control terminal, said first and second control switching means for performing complementary first and second switching operations, including a switching operation to switch a current for driving a light emitting device, in accordance with voltages applied to said first and second control terminals;
   voltage regulator means for generating a predetermined voltage; and application means for applying the predetermined voltage generated by said voltage regulator means to one of said first and second control terminals in accordance with an input signal, and for applying a voltage different from the predetermined voltage to the other of said first and second control terminals hereby the switching means of the control terminal that received the predetermined voltage is turned on.

2. A diver for a light emitting device according to claim 1, wherein the light emitting device comprises a laser diode an said voltage regulator means comprises a Zener diode.

3. A driver for a light emitting device according to claim 1, wherein each of said first and second switching means comprises a constant current differential switching transistor, and wherein said application means applies the predetermined voltage to one of said first and second control terminals of said switching means in accordance with the input signal to activate the same and applies a dropped voltage to the other of said first and second control terminals of said switching means to inhibit the same.

4. A diver for a light emitting device, comprising:
first and second switching means connectable with the light emitting device for controlling emission of light by the light emitting device, said fist and second switching means for performing switching operations in accordance with input signals; and
application means for applying a predetermined voltage to one of said fist and second switching means to cause said first and second switching means to perform the switching operation, said application means applying voltages of essentially equal levels to said first and second switching means,
wherein said application means includes a Zener diode and third and fourth switching means for driving said first and second switching means, respectively, wherein said third and fourth switching means are connected to said Zener diode.

* * * * *

UNITED STATES PATENT AND TRADEMARK OFFICE
CERTIFICATE OF CORRECTION

PATENT NO. : 5,115,147

DATED : May 19, 1992

INVENTOR(S) : Akihisa Kusano, et al.

It is certified that error appears in the above-identified patent and that said Letters Patent is hereby corrected as shown below:

On the title page, Item [56] under the References Cited heading, "4,856,011  8/1989  Shibada" should read --4,856,011  8/1989  Shimada, et al.--;

"60-273787  11/1987  Japan" should read --62-273787  11/1987  Japan--; and change "CHD-LOC" on the second line under Other Publications to --CDH-LOC--.

Column 1, line 25, change "the" to --The--; and line 48, change "$(V_{BE})$" to --$(V_{BE})$.--.

Figure 5:
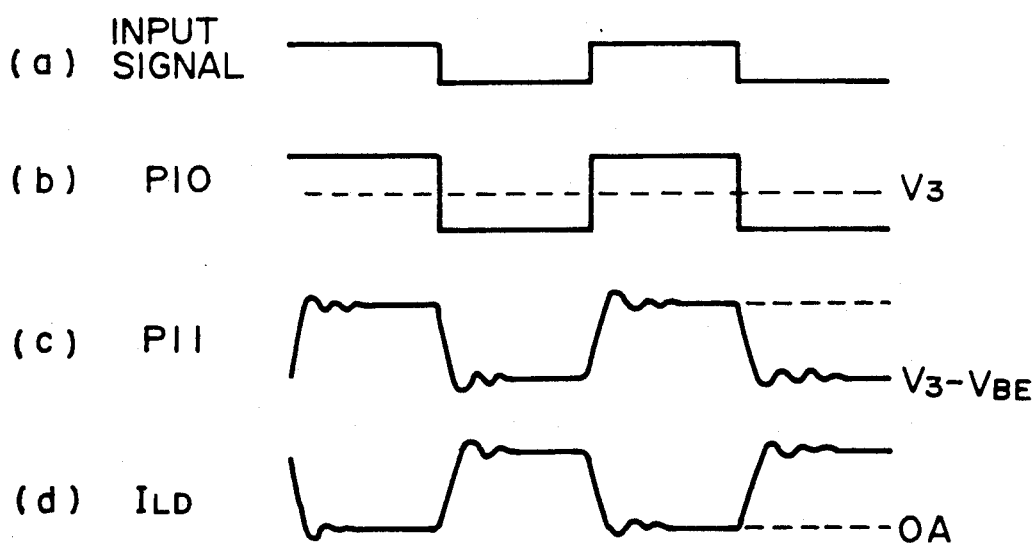
FIG. 5(a-5(d) show a timing chart in the prior art circuit.
Figure 6:
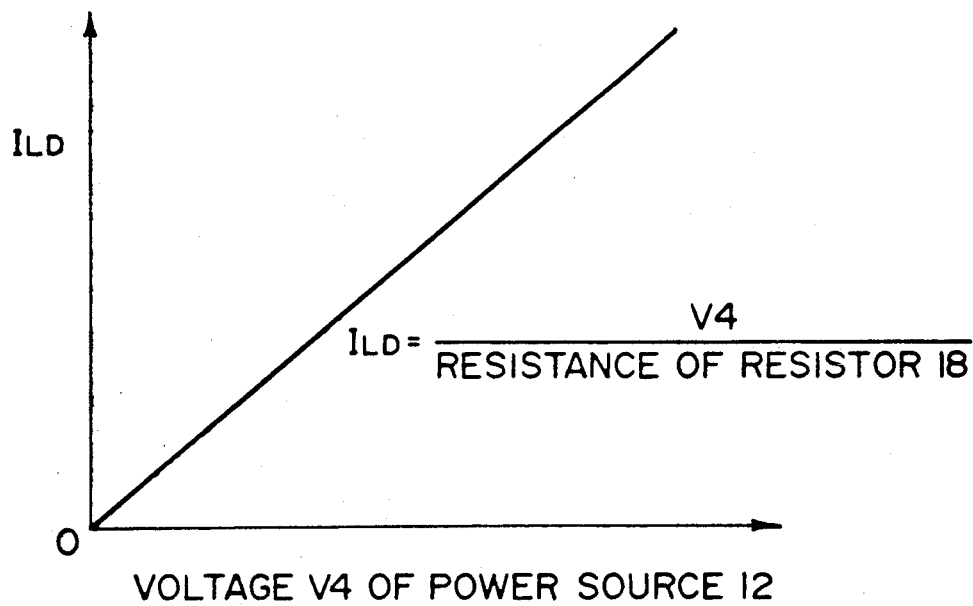
FIG. 6 shows a characteristic curve of a constant current circuit.
Figure 7:
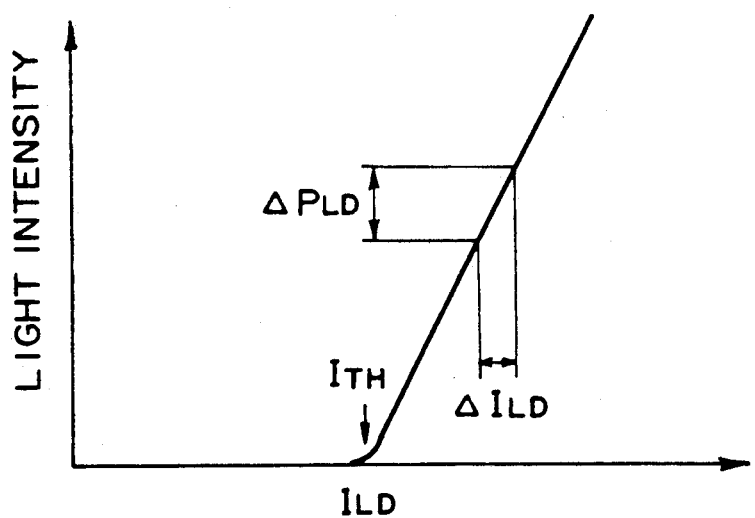
FIG. 7 shows a light intensity-current characteristic of a laser diode.

Column 2, line 36, change "FIG. 5(a-5(d)" to --FIG. 5(a) - 5(d)--.

Column 3, line 5, change "is" to --are--; and line 30, change swithced" to --switched.--

Column 4, line 16, change "denote" to --denotes--;

line 19, change "redigest" to --regist--;

line 20, change "redigest" to --regist--; and line 56, change "claim" to --claims--.

UNITED STATES PATENT AND TRADEMARK OFFICE
CERTIFICATE OF CORRECTION

PATENT NO. : 5,115,147

DATED : May 19, 1992

INVENTOR(S) : Akihisa Kusano, et al.

It is certified that error appears in the above-identified patent and that said Letters Patent is hereby corrected as shown below:

Column 5, lines 6 to 7, change "terminals hereby" to --terminals, whereby--;

line 10, change "diver" to --driver--; and line 12, change "an" to --and--.

Column 6, line 3, change "diver to --driver--;

line 6, change "fist" to --first--; and line 10, change "fist" to --first--.

Signed and Sealed this

Twenty-first Day of September, 1993

Attest:

BRUCE LEHMAN

*Attesting Officer*    *Commissioner of Patents and Trademarks*